United States Patent [19]
Barnes

[11] Patent Number: 5,079,219
[45] Date of Patent: Jan. 7, 1992

[54] STORING INFORMATION-BEARING SIGNALS IN A SUPERCONDUCTIVE ENVIRONMENT USING VORTICES AS DIGITAL STORAGE ELEMENTS

[75] Inventor: Frank S. Barnes, Boulder, Colo.

[73] Assignee: University of Colorado Foundation, Inc., Boulder, Colo.

[21] Appl. No.: 455,476

[22] Filed: Dec. 22, 1989

[51] Int. Cl.$^5$ .................. H01B 12/00; G11B 5/02; G11B 5/74; G11B 23/00
[52] U.S. Cl. .................................. 505/1; 360/55; 360/131; 505/834
[58] Field of Search .............. 360/55, 131–133; 505/700–701, 705, 831, 832, 833, 834, 838–840

[56] References Cited

U.S. PATENT DOCUMENTS

| | | | |
|---|---|---|---|
| 3,201,765 | 8/1965 | Pearl | 505/833 X |
| 4,186,441 | 1/1980 | Baechtold | 505/832 X |
| 4,843,504 | 7/1989 | Barnés | |

FOREIGN PATENT DOCUMENTS

| | | | |
|---|---|---|---|
| 63-316192 | 12/1988 | Japan | 360/DIG. SC |
| 1-42038 | 2/1989 | Japan | 360/DIG. SC |

OTHER PUBLICATIONS

"Suspension in Magnetic Recording Using High $T_c$ Superconductors" by Bruce R. Scharf, Walter Eidelloth, Frank S. Barnes, Matthew Dugas, IEEE Transactions on *Magnetics*, vol. 25, No. 5, Sep. 1989, pp. 3230–3232.
"Optical Response of Bulk BI-Sr-Ca-Cu-O", by Walter Eidelloth & Frank S. Barnes, reprented from *IEEE Journal of Quantum Electronics*, vol. 25, No. 11, Nov. 1989.
"Applications of High $T_c$ Superconductors to Magnetic Recording Means", by M. Dugas, W. Eidelloth & F. Barnes, AQ-03, MMM/Intermag '88, Vancouver.

Primary Examiner—A. J. Heinz
Attorney, Agent, or Firm—H. F. Somermeyer; Earl C. Hancock

[57] ABSTRACT

Information-bearing signals are stored using high-temperature superconducting materials. Type II semiconductors, such as materials in the perovskite class, are used for recording. A vortex of electrical current is induced in a layer of the super-conductive materials which causing a magnetic field extending from the axis of the vortex. One or more vortices can be used to record one bit of information. The induced magnetic field is sensed for reading the stored information.

12 Claims, 1 Drawing Sheet

STORING INFORMATION-BEARING SIGNALS IN A SUPERCONDUCTIVE ENVIRONMENT USING VORTICES AS DIGITAL STORAGE ELEMENTS

DOCUMENT INCORPORATED BY REFERENCE

Barnes U.S. Pat. No. 4,843,504 is incorporated herein by reference. This patent protects an invention of the present applicant.

FIELD OF THE INVENTION

The present invention relates to superconductive apparatus, particularly those devices which are capable of storing information-bearing signals.

BACKGROUND OF THE INVENTION

The patent incorporated by reference shows a disk type signal recorder operable in a superconductive environment. The disk includes superconductive materials for storing information bearing signals and is read or sensed using Superconducting Quantum Interference Devices (SQUIDS), a known form of junction devices in superconductive materials. The signals may be recorded using the known longitudinal recording techniques in a spinning signal storing disk. Longitudinal recording has magnetic flux aligned with the surface of the signal-storing member; i.e. the magnetic dipole is parallel to the surface of the disk. In the case of a superconductor, a circulating current induces the magnetic flux. Another type of magnetic recording is the so-called vertical recording wherein the magnetic dipole is perpendicular to the surface of the surface in a signal-storing member. The present invention uses vertical recording techniques.

Type II superconductors, used in the present invention, include materials in the perovskite class of materials. It is known that so-called vortices can be induced in these materials. The vortex can be created by a vertical magnetic field penetrating into a sheet of perovskite material from a recording surface to induce a circulating electrical current in the sheet of material (the current forms a circle when viewed into the recording surface of the material). The circulating electrical current then maintains a magnetic dipole perpendicular to the plane of the materials. A vertically flowing magnetic flux in a sheet Type II superconductor creates a circulating current in the plane of sheet. The directional sense of the circulating electrical current depends on the direction of the vortex-inducing magnetic flux and becomes indicative of the information bit stored in the created vortex. A clockwise circulating current, which maintains a magnetic dipole having a first magnetic orientation (when the circulating current is in a horizontal plane, the north pole of the dipole points downwardly), indicates a first binary state while a counter-clockwise current flow maintains an oppositely poled magnetic dipole to indicate a second binary state. Either binary state can be denoted as a one or zero. So long as the perovskite material is in a superconductive state (type II superconductor), the electrical current flows with essentially no electrical impedance for maintaining a magnetic flux which flows through the center of the vortex perpendicular to the surface of the superconductive recording material.

Each vortex has a constant amount of magnetic flux (quantum of magnetic flux) equal to the quotient of Planck's constant "h" divided by twice the electrical charge value "e". This value is about $2 \cdot 10^{-15}$ gauss. A superconducting vortex is a true digital or a minimal discrete value for storing one bit of information.

SUMMARY OF THE INVENTION

It is an object of this invention to provide a high density signal storage apparatus using superconductive techniques capable of storing one bit of information in about an surface area of about one micron square and containing a large number of flux quanta.

In accordance with the invention, apparatus for storing information-bearing signals in a superconductive environment includes a recording disk consisting of a recording layer of a type II superconductive material on a substrate, said material having a predetermined critical temperature above which superconducting properties are lost and below which superconducting properties are exhibited; housing means maintains a superconductive environment inside a housing including a temperature below said critical temperature and enclosing said recording disk; drive means in the housing means rotatably support and spin the recording disk; and transducer means in the housing means is radially-movably disposed with respect to the recording disk for recording and sensing vertically recorded signals on the recording disk and supplies a vertical recording field for inducing superconductive vortices in said recording layer and for sensing the superconductive current maintained magnetic flux of said induced vortices wherein respective predetermined ones of the vortices store one bit of information indicated by the circulating current maintained magnetic flux.

The foregoing and other objects, features, and advantages of the invention will be apparent from the following more particular description of preferred embodiments of the invention, as illustrated in the accompanying drawings.

DETAILED DESCRIPTION

Figure 1:
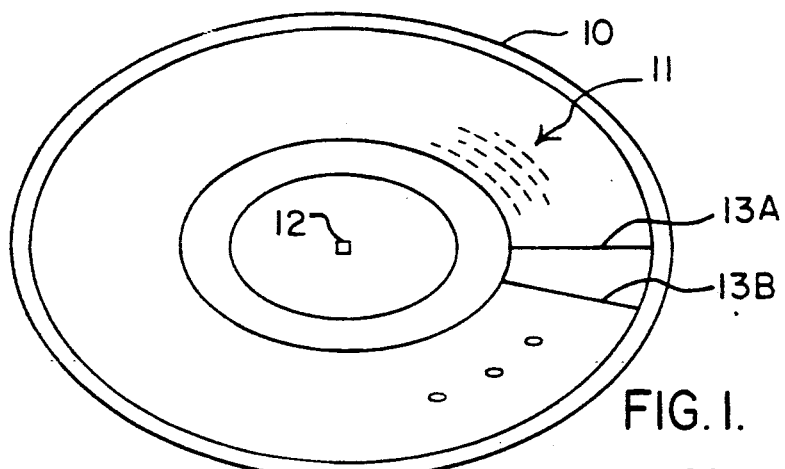
FIG. 1 is a plan schematic view of a signal-storing disk or member.

The present invention employs high-temperature superconductors for improving performance of signal recording, such as used in disks, tapes, sheets and the like. The description is directed to a recorder using a signal-storing disk 10 supported for rotation about axis 12 and having a signal recording band 11 of concentric record tracks (not separately shown). The usual radially-extending sector marks 13 may be employed for physically demarking addressable signal-storing areas on disk 10, as is known. The ellipsis indicates that disk 10 may have a large number of such sector lines 13. Information is recorded on disk 10 by inducing "superconductive vortices" in the addressable signal-storing areas, each of the addressable signal-storing areas is capable of storing a large number of information bits, as will become apparent.

A housing means 20 encloses disk 10 and a later-described signal recorder. Housing means 20 includes means for cooling the housing enclosed space to a superconductive enabling temperature, for type II superconductors, the housing temperature is maintained below the critical temperature of the recording material in disk 10, as will become apparent. Disk 10 includes a recording coating 21 of a perovskite material plated, or otherwise deposited, onto substrate 22. In one embodiment, substrate 22 consisted of a strontium titanate plate. Magnesium oxide or other material may be easily substituted for strontium titanate. In the one embodiment, recording coating or layer 21 consisted of barium-yttrium-copper oxide ($Y\ Ba_2\ Cu_3\ O_x$, where x was about 7.5). Bismuth and Thallium compounds were also determined to be satisfactory as a recording layer; in fact, many superconductive materials in the perovskite class of materials are satisfactory. In one embodiment, layer 21 had a thickness of about 1000 Angstrom units.

Disk 10 is rotatably supported on spindle 23 which can either extend from a superconductive motor as shown in the Barnes patent, supra, or be coupled to a motor (not shown) outside housing means 20 by using a magnetic clutch (not shown). Axis 12 is coaxial to spindle 23. Information-bearing signals are recorded onto and sensed from disk 10 by a vertical-field magnetic head 24 mounted on a head arm 25 for radial movements, indicated by double arrow 26 across recording area 11 to access any one of a large number of concentric signal-storing tracks. Electrical connections to transducer 24 is via signal line 27 which connects to usual recording and readback circuits, not shown.

Figure 2:
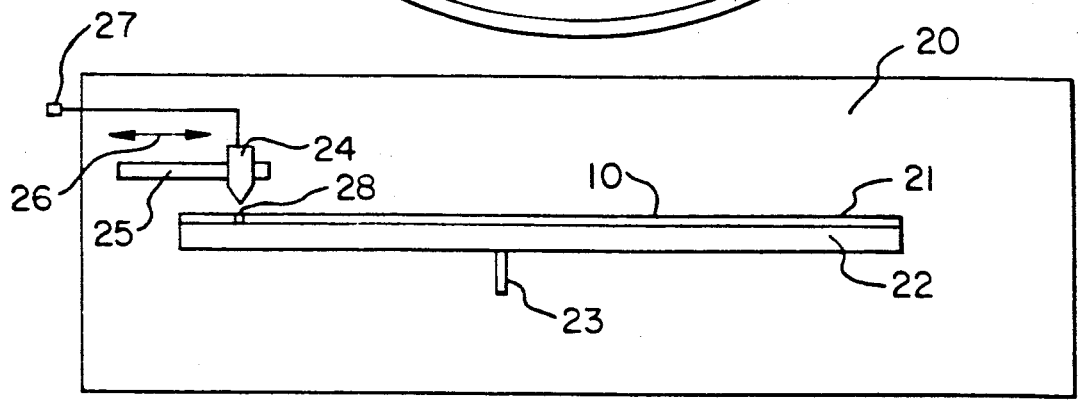
FIG. 2 is a diagrammatic showing of apparatus having a superconductive environment with a recording device in the environment and using the FIG. 1 illustrated disk.

Transducer 24 is constructed using known superconductive techniques. A small magnetically permeable wire is encased in a tubular shield, preferably of magnetic shielding materials with a distal end of the structure facing coating 21. This arrangement and orientation focuses a vertical magnetic field into coating 21; any known flux return path structures may be used to complete a flux return path. As best seen in FIG. 2, transducer 24 has recorded a binary signal by inducing vortex 28 in coating 21 using a vertical magnetic recording field. In an induced vortex, the resultant induced electrical current maintains a vertical magnetic flux, i.e. magnetic flux which is orthogonal to the surface of signal-storing layer 21. It has been determined that recording using superconductive vortices can yield a signal-to-noise ratio of at least about 100 to 1.

Figure 3:
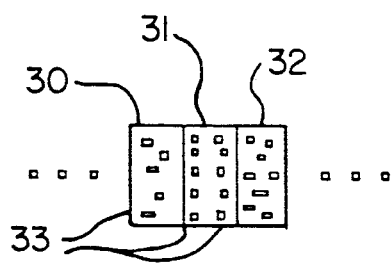
FIG. 3 illustrates a portion of a signal-storing track on the FIG. 1 illustrated disk.

Each of the addressable signal storing areas is divided into bit storing areas, such as areas 30, 31 and 32 shown in FIG. 3. Bit storing areas 30-32 are in one track having a large multiplicity of such bit storing areas, all additional areas indicated by the two ellipses in FIG. 3. While each bit storing area can be limited to having but one vortex, a plurality of vortices 33 can be used in each of the bit storing areas. Bit storing areas 30 and 32 show a plurality of vortices in a somewhat jumbled arrangement while bit storing area shows its vortices in an apparent ordered rectangular array. Either arrangement provides satisfactory signal storage. A rectangular or ordered array of vortices is achievable by creating layer 21 as a lattice, each vortex being anchored on predetermined elements of the lattice. Internal lattice "Defects" in the perovskite recording layer 21 "anchors" vortices in a irregular array, such as shown in bit areas 30 and 32. Anchoring vortices prevents any drift of the vortices within layer 21. Anchoring inherently occurs during the recording or vortex inducing process and can be enhanced by irradiating the disk with high energy particles. The formation of perovskite material is known and not further discussed for that reason.

Figure 4:
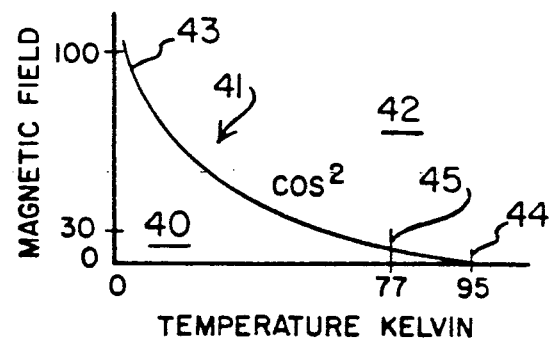
FIG. 4 graphically shows temperature limits on type II superconductive materials in the perovskite class of materials as used in the FIG. 1 illustrated disk.

FIG. 4 illustrates the superconductive characteristics of perovskite materials. The $Cos^2$ curve 41 denotes the boundary between area 40 in which the perovskite materials are type II superconductors and area 42 in which no superconductivity is exhibited. The area 40 includes the region where low magnetic field intensities induce vortices and where recording in accordance with the present invention can occur. At point 44, the critical temperature is shown as 95° K., therefore this graph is for barium-yttrium-copper oxide. An operating temperature of 77° K., as at point 45, was used in the one embodiment, supra. Numeral 43 denotes 4° K. The vertical ordinate denotes the effective magnetic flux density in gauss induced by the circulating current in a vortex. The colder the superconductive material the greater the vortex magnetic flux density which can be supported. For example, at the operating temperature at point 45, a maximal flux density of about 30 gauss occurs before the material reverts from the superconductive state to a normal or non-superconductive state. At 4° K. a 100 gauss flux density may occur. Since it is eminently less expensive to operate at higher temperatures, it is desired to operate at as high a temperature as possible; it has been determined that at 30 gauss, satisfactory signal recording and reproducing operations can be achieved. Type II superconductor operation of perovskite materials may be obtained at any point area 40. It is preferred that the operating temperature be as close to the critical temperature 44 as possible while achieving a reasonable signal-to-noise ratio and stable operating characteristics.

Figure 5:
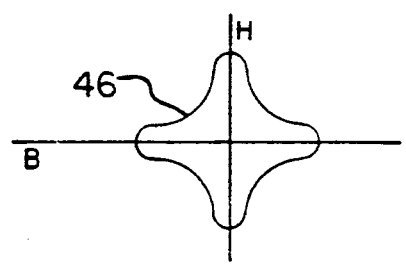
FIG. 5 graphically shows a hysteresis loop for a material in the perovskite class of materials.

FIG. 5 shows a typical hysteresis curve 46 of a perovskite type II superconductive material. Materials having hysteresis is one requirement for storing signals in a vortex.

While the invention has been particularly shown and described with reference to preferred embodiments thereof, it will be understood by those skilled in the art that various changes in form and details may be made therein without departing from the spirit and scope of the invention.

What is claimed is:

1. In apparatus for storing information-bearing signals in a superconductive environment, including, in combination:

a recording disk consisting of a recording layer of a type II superconductive material on a substrate, said material having a predetermined critical temperature above which superconducting properties are lost and below which superconducting properties are exhibited;

housing means for maintaining a superconductive environment including a temperature below said critical temperature and enclosing said recording disk;

drive means in the housing means for rotatably supporting and spinning the recording disk; and transducer means in the housing means and being radially-movably disposed with respect to the recording disk for recording and sensing recorded signals on the recording disk and supplying a vertical recording field for inducing superconductive vortices in said recording layer and for sensing the induced vortices wherein respective predetermined ones of the vortices store one bit of information indicated by the vortex circulating current direction.

2. In the apparatus set forth in claim 1 further including, in combination:
said recording layer consists of a material selected from the perovskite class of materials.

3. In the apparatus set forth in claim 2 further including, in combination:
said recording layer consists of barium-yttrium-copper oxide or other high temperature superconductive materials, and
the temperature maintained by the housing means is about 77° K.

4. In the apparatus set forth in claim 2 further including, in combination:
said housing means maintains a temperature below said critical temperature of not less than 80 per cent of the critical temperature.

5. In the apparatus set forth in claim 2 further including, in combination, said recording layer having an internal lattice for anchoring said vortices.

6. In the apparatus set forth in claim 1 further including, in combination:
said housing means maintains a temperature of greater than one-half the critical temperature.

7. In the apparatus set forth in claim 1 further including, in combination:
said transducer means vertically records information-bearing signals with one bit of information is represented by a predetermined plurality of vortices in said recording layer with all vortices representing the respective bits having a like polarity of remanent magnetization.

8. In the apparatus set forth in claim 1 further including, in combination:
said transducer means vertically records information-bearing signals with one bit of information being represented by one or more of said vortices, a first informational state of information being represented by a clockwise direction of electrical current in each vortex and a second informational state of information being represented by a counter-clockwise direction of electrical current in each vortex.

9. In apparatus for storing information-bearing signals in a superconductive environment, including, in combination:
housing means for maintaining a superconductive environment in a housing including keeping a temperature inside the housing at predetermined temperature;
a memory apparatus inside the housing including a signal-storage member having addressable signal-storing areas and an access mechanism for addressably accessing said signal-storing areas and recording information in the signal-storage member by inducing superconductive vortices each of which has circulating current maintained magnetic flux; and
said signal storage member including a signal recording layer having a material selected from the perovskite class of materials, means for moving said recording layer relative to said access mechanism to present different recording areas to the access mechanism said selected material having a critical temperature below which the selected material exhibits superconducting properties, said predetermined temperature being a temperature lower than said critical temperature and a predetermined number of said signal-storing areas each including a one of said superconductive vortices for storing an information bearing signal in the respective signal-storing area.

10. In the apparatus set forth in claim 9 further including, in combination:
said housing means maintaining said predetermined temperature at a temperature which is not less than 75 per cent of the difference between the critical temperature and an absolute zero temperature.

11. In the apparatus set forth in claim 9 further including, in combination:
said housing means maintaining said predetermined temperature at a temperature which is within the top 15 percentile of the critical temperature as measured from absolute zero temperature.

12. In the apparatus set forth in claim 9 further including, in combination, said recording layer having an internal lattice for anchoring said vortices.

* * * * *